(12) United States Patent
Nicoletti et al.

(10) Patent No.: US 7,173,179 B2
(45) Date of Patent: Feb. 6, 2007

(54) SOLAR CO-GENERATOR

(75) Inventors: Stephen Adolph Nicoletti, Little Rock, AR (US); Roger M. Hawk, Little Rock, AR (US)

(73) Assignee: The Board of Trustees of the University of Arkansas, Little Rock, AR (US)

( * ) Notice: Subject to any disclaimer, the term of this patent is extended or adjusted under 35 U.S.C. 154(b) by 560 days.

(21) Appl. No.: 10/195,932

(22) Filed: Jul. 16, 2002

(65) Prior Publication Data
US 2004/0011395 A1    Jan. 22, 2004

(51) Int. Cl.
*H01L 31/052* (2006.01)
*H01L 31/04* (2006.01)

(52) U.S. Cl. .................. 136/246; 136/259; 136/253; 136/247; 136/291; 136/248; 136/256; 257/432; 257/433; 257/434; 257/436; 257/437

(58) Field of Classification Search ............. 136/246, 136/259, 253, 247, 291, 248, 256, 265; 257/432, 257/433, 434, 436, 437
See application file for complete search history.

(56) References Cited

U.S. PATENT DOCUMENTS

| | | | |
|---|---|---|---|
| 3,130,084 A | | 4/1964 | Loring |
| 4,135,537 A | * | 1/1979 | Blieden et al. ............. 136/247 |
| 4,175,980 A | | 11/1979 | Davis et al. |
| 4,191,164 A | | 3/1980 | Kelly |
| RE30,584 E | * | 4/1981 | Russell ....................... 136/246 |
| 4,340,031 A | | 7/1982 | Niedermeyer |
| 4,396,690 A | | 8/1983 | Gordon et al. |
| 4,425,905 A | | 1/1984 | Mori |
| 4,584,428 A | * | 4/1986 | Garlick ........................ 136/257 |
| 4,586,334 A | | 5/1986 | Nilsson, Sr. et al. |
| 4,594,605 A | * | 6/1986 | Kramer ....................... 257/437 |

(Continued)

FOREIGN PATENT DOCUMENTS

DE    3415112 A1    10/1985

(Continued)

OTHER PUBLICATIONS

IBM Technical Disclosure Bulletin, bulletin No. NA80013449, vol. 22, issue 8A, p. 3449, published Jan. 1, 1980.*

(Continued)

*Primary Examiner*—Alan Diamond
(74) *Attorney, Agent, or Firm*—J. Charles Dougherty

(57) ABSTRACT

A solar co-generator for producing both heat energy and electricity is disclosed. A solar concentrator directs sunlight into a container lined with solar cells and filled with a thermal transfer fluid. The fluid is transparent with respect to certain wavelengths of light that may be converted to electricity by the solar cell, but is opaque with respect to longer wavelengths, particular the infrared band. The infrared portion of the sunlight heats the thermal transfer fluid, which then transfer that heat through a storage facility using a heat exchange mechanism. The thermal transfer fluid increases the efficiency of photovoltaic generation by preventing heating of the solar cells due to infrared radiation. The thermal transfer fluid may be a mixture containing barium sulfate and a suspension of zinc sulfide phosphors. A fluorescing anti-reflective coating may be applied to the solar cells to further increase efficiency.

36 Claims, 4 Drawing Sheets

U.S. PATENT DOCUMENTS

| | | | |
|---|---|---|---|
| 4,756,301 A | | 7/1988 | Dane |
| 5,102,579 A | * | 4/1992 | Inaho et al. .......... 252/301.4 S |
| 5,228,293 A | | 7/1993 | Vitale |
| 5,282,995 A | * | 2/1994 | Paul et al. .................. 507/241 |
| 5,342,453 A | * | 8/1994 | Olson .......................... 136/262 |
| 5,371,730 A | * | 12/1994 | Maeda et al. ................ 720/725 |
| 5,606,413 A | * | 2/1997 | Bellus et al. ................ 356/326 |
| 5,685,151 A | | 11/1997 | Ross |
| 5,687,706 A | * | 11/1997 | Goswami et al. ...... 126/263.01 |
| 5,727,585 A | | 3/1998 | Daume et al. |
| 5,882,434 A | | 3/1999 | Horne |
| 5,899,071 A | | 5/1999 | Stone et al. |
| 6,003,509 A | | 12/1999 | Chiavarotti et al. |
| 6,080,927 A | | 6/2000 | Johnson |
| 6,336,452 B1 | | 1/2002 | Tirey, Jr. |
| 6,407,328 B2 | | 6/2002 | Kleinwächter |
| 2001/0007261 A1 | * | 7/2001 | Kleinwachter .............. 136/246 |

FOREIGN PATENT DOCUMENTS

| | | | |
|---|---|---|---|
| EP | 846924 A2 | 6/1998 |
| GB | 2308885 | 7/1997 |
| JP | 2001044736 A | 2/2001 |
| JP | 2001050597 A | 2/2001 |

OTHER PUBLICATIONS

PQ Corporation, "KASIL® Potassium Silicates for the Electronics Industry," Bulletin No. 17-105A.

PQ Corporation, "Sodium Silicates: Versatile, Inorganic Adhesives," Bulletin 12-30.

L.D. Partain, "Solar Cells and Their Applications," Wiley & Sons, 1995, pp. 204-209.

L.D. Partain, "Solar Cells and Their Applications," Wiley & Sons, 1995, pp. 1-51.

C. Wehrli, "Extraterrestrial Solar Spectrum," Pub. No. 615, Physikalisch-Meteorologisches Observatorium and World Radiation Center, Davos, Switzerland, Jul. 1985.

Martin A. Green, "Solar Cells Operating Principles, Technology and System Applications," The University of New South Wales, 1986, pp. 204-221.

* cited by examiner

SOLAR CO-GENERATOR

BACKGROUND OF THE INVENTION

The present invention relates to a generator that produces both heat and electricity from solar energy, and in particular to a solar energy co-generator that utilizes a transfer fluid to capture heat energy and increase the efficiency of photovoltaic generation.

Solar energy is a renewable energy source with many well-known advantages over traditional fossil and nuclear energy resources. Solar energy has remained a largely untapped field, however, because the efficiency of existing solar power collection systems is generally too low to justify the required capital investment for these systems. While most of the electromagnetic radiation received from the sun falls in the visible spectrum (a wavelength range of approximately 430 to 690 nm), the sun's radiation also includes other components. In particular, solar energy incident upon the earth includes infrared radiation, a band that covers a wavelength range of approximately 1 µm to 1 mm. Typical solar cells, that is, devices designed to convert electromagnetic radiation from the sun into electricity, are only able to utilize energy within a relatively narrow wavelength band in the visible spectrum. Infrared radiation is not only unusable by such solar cells, but the heat caused by incident infrared radiation actually lowers the efficiency of typical semiconductor-based solar cells. Existing thermophotovoltaic cells, which are designed to capture infrared radiation and convert it to electricity, have very low efficiencies and are thus limited to a small number of specialized applications, such as recapturing infrared radiation emitted by heated surfaces. In addition, existing solar cells generally convert longer wavelength visible light into electricity more efficiently than they do shorter wavelength radiation. As a result of these limitations, much of the electromagnetic energy incident on a typical solar cell cannot be converted into electricity. It would be desirable therefore to develop a method of efficiently converting a broader band of the sun's radiation to usable energy, thereby increasing the efficiency of a solar energy collector and making such systems practical solutions for a greater number of energy applications.

Prior art systems have been developed to capture heat energy (that is, energy resulting from incident infrared radiation) from the sun. For example, U.S. Pat. No. 6,336,542 to Tirey, Jr. discloses a water heating system utilizing a reflective parabolic dish as a solar concentrator. A fluid line extends through a support pole and is coiled at the focal point of the dish. Solar energy, which is concentrated at the fluid line coil by the reflective dish, heats water that is pumped through the system. Another example, disclosed in U.S. Pat. No. 5,685,151 to Ross, is a system that utilizes a solar concentrator to capture solar energy and focus it onto a cavity-type solar boiler. The interior walls of the boiler are formed by pipes that carry liquid sodium, which acts as a heat transfer medium. The heat causes the sodium to boil, and the sodium vapor is pumped to a heat exchange system in communication with a molten sodium chloride tank. The sodium returns to a liquid state as a result of the heat exchange, and is pumped in a circuit back to the boiler. The heat now stored in the sodium chloride tank is then transferred again by steam pipes as needed and used to power electrical generators. Similarly, U.S. Pat. No. 4,586,334 to Nilsson, Sr. et al. discloses a system for collecting solar power with a concentrator and storing it in a phase change medium, whereby energy may be withdrawn on demand using a variable heat exchange system. U.S. Pat. No. 5,228,293 to Vitale discloses a system that captures solar energy in a cavity receiver and transfers it through a thermal transport fluid to an engine that may produce both electrical power and hot water. The system also includes an auxiliary fossil or biomass heater that may supplement or completely replace the cavity receiver.

There have also been attempts to develop solar energy co-generators, that is, solar energy collection systems that capture energy from both the visible and infrared spectrums, utilizing a combination of solar cells and heat transfer fluids, to produce both electricity and heat energy. Such systems should in theory operate with greater efficiency than systems designed to produce heat or electricity alone since a wider portion of the sun's spectral band is utilized. Such systems would have important practical applications, such as using electricity to power electrical appliances, and heat for home heating or hot water production. An example of an attempt to design such a system is disclosed in U.S. Pat. No. 6,080,927 to Johnson. The Johnson system includes a solar concentrator that focuses sunlight onto the solar cells. A heat transfer system is placed in contact with the solar cells in order to carry away heat resulting from the infrared radiation incident upon the solar cells. The heat transfer system is simply water or the like pumped through pipes in contact with the solar cells, with a heat exchanger that transfers heat from the heat transfer system to some useful work, such as heating a swimming pool. By carrying heat away from the solar cells, this system allows the solar cells to operate more efficiently. A further example is provided by U.S. Pat. No. 4,191,164 to Kelly, which teaches a system with a solar concentrator that provides solar energy to pre-heat a flash boiler pipe for steam production. The system also includes an array of solar cells mounted at the cold water entrance end of the pipe. The cold water serves as a thermal transfer fluid that dissipates heat from the solar cells as in Johnson, while the infrared radiation is used for pre-heating the boiler pipe water.

Prior art co-generation systems such as Johnson and Kelly suffer from some significant limitations and disadvantages. One critical problem with these systems is that while they may include a heat transfer medium to draw heat away from the solar cells, they do not prevent the heating of the solar cells by infrared radiation. Since these systems typically include a solar concentrator, the heat generated at the solar cells may be quite intense. Although the use of a heat transfer system in contact with the cells does provide some cooling, the efficiency of the solar cells is still reduced simply by the fact that the infrared radiation reaches the cells at all. A system whereby a significant part of the sun's infrared radiation never reaches the cells, but is instead directly converted to heat energy before it reaches the cell surface, would be inherently more efficient.

One system that attempts to address this problem is taught by U.S. Pat. No. 6,407,328 to Kleinwächter. Kleinwächter teaches that a liquid medium that permits passage of radiation energy useful for photovoltaic effects, but absorbs the remaining radiation energy, would be desirable. Kleinwächter attempts to achieve this by the use of water in combination with a fluoropolymer film. Kleinwächter teaches that water absorbs only the longer-wave radiation and allows passage of wavelengths that may be useful for photoelectric production, while the fluoropolymer film blocks only a portion of the short-wave range. As a result, most radiation in the band that is useful to solar cell electricity production passes through while the longer-wave radiation heats the water passing over the solar cells. Kleinwächter further teaches a heat exchange system for cooling of the water.

A significant limitation of the system taught by Kleinwächter is that it provides no means by which to disperse radiation uniformly across the solar cell. Solar cells reach their maximum efficiency only when radiation is evenly distributed across their functioning surface. Providing a uniform distribution of light across a solar cell is particularly difficult where a solar concentrator is employed as part of the collection system. One method that has been utilized to alleviate this problem is to employ a luminescent material between the solar cell surface and the sun. Luminescent materials have the property that they may absorb light falling upon them from one direction and reemit light that is isotropic. As a result, a luminescent material may be constructed that will "smooth" the intensity distribution of incident sunlight across a surface, such as a solar cell. An example of a system that attempts to utilize this principle is taught in U.S. Pat. No. 4,175,980 to Davis et al. Davis et al. teaches that luminescent materials may be suspended in a sheet of glass or plastic positioned above a solar cell in order to smoothly distribute light across the solar cell.

The use of a luminescent material as described above may also increase the efficiency of a solar cell by producing light of a frequency that is well matched to the performance characteristics of the solar cell. Roughly ten percent of the sun's electromagnetic energy falls in a wavelength range of about 305 to 450 nm (that is, from near ultraviolet to blue). Typical semiconductor solar cells, however, operate more efficiently at somewhat longer wavelengths, toward the red end of the visible spectrum. In addition to their isotropic scattering property, certain luminescent materials also act to absorb visible light at the higher frequencies and emit light at the lower, more desirable frequencies. Thus the deployment of a luminescent material between a solar cell and the sun (or a concentrator) may serve to increase efficiency not only through more efficient distribution of incident light upon the solar cell but also through frequency conversion. U.S. Pat. No. 4,135,537 to Blieden et al. teaches a light collector that attempts to take advantage of this idea. Blieden et al. teaches that a luminescing fluid is deployed over the solar cell surface. This luminescing fluid serves to isotropically distribute light across the solar cell surface and also acts as a heat dissipation medium. Blieden et al. also teaches, however, that the luminescing agent may be chosen for its ability to emit light in an energy level range that suits the conversion characteristics of the particular solar cell being used.

The device taught by Blieden et al. also has significant limitations. Importantly, this device depends entirely upon luminescent materials to isotropically distribute light. As Blieden et al. discloses, this is not truly isotropic scattering, but is rather isotropic re-emission. In other words, the fluid taught by Blieden et al. does not simply scatter incident light in all directions, but instead absorbs the incident light (by means of luminescent materials in the fluid) and re-emits longer wavelength light isotropically. Although Blieden et al. claims that the invention is directed to the use of any luminescent material, in fact it teaches the use of only one class of such materials, namely, organic dyes. Organic dyes degrade with use, and this degradation is hastened by the absorption and re-emission as taught by Blieden et al. Furthermore, this degradation would be even further hastened by a higher concentration of incident light reaching the luminescent material, such as would be the case if one attempted to combine the Blieden et al. device with a solar concentrator. The constant replacement of transfer fluid material would render the device of Blieden et al. impractical in many-real-world applications, particularly with respect to applications that make use of a solar concentrator.

Another limitation on the use of organic dyes in such applications is self-absorption. These dyes not only absorb light in the shorter wavelength bands but in the longer wavelength bands as well. Thus the dye material could, for example, absorb incident light, re-emit light at a longer wavelength, and then re-absorb the emitted light. This re-absorption lowers the efficiency of the system and would hasten the degradation of the organic dyes.

Finally, the prior art includes the use of anti-reflective coatings to prevent the loss of efficiency due to reflective losses at the point of light entry into a solar cell. Materials such as zinc sulfide, an inorganic phosphor, have been used for this purpose, due to this material's high index of refraction. In a co-generator where a fluid is disposed above a solar cell, a protective coating must be provided between the solar cell and fluid in order to protect the solar cell from damage. This coating material is typically glass. The anti-reflective coating on the solar cell is typically matched to the refractive index of the protective coating in order to minimize losses. One important limitation of such prior art anti-reflective coatings, however, is that they provide no means by which to modify the wavelength of light passing into the solar cell in order to increase the solar cell's efficiency.

It would therefore be desirable to develop a solar co-generator with a long-life transfer fluid that blocks longer-wave radiation from reaching the solar cells and also converts that radiation to heat energy, while simultaneously providing isotropic scattering (rather than simply isotropic re-emission) and selected wavelength modulation with respect to the light reaching the solar cell. Further, it would be desirable to employ with such a co-generator an anti-reflective coating on the solar cells that serves to further provide wavelength modulation to increase the efficiency of the solar cells. Finally, it would be desirable to create such a solar co-generator that could be used with a light concentrator without significantly reducing the life of the transfer fluid used in the system.

BRIEF SUMMARY OF THE INVENTION

The present invention is directed to a co-generator system with improved energy conversion efficiency using a transfer fluid that acts to block longer-wavelength radiation from reaching the solar cells, thereby increasing photovoltaic efficiency, and also to diffuse the light incident upon the solar cells to further improve conversion efficiency. According to the present invention, a container houses a thermal transfer fluid that includes a suspension of an isotropic scattering agent and luminescent material. In certain preferred embodiments, the isotropic scattering agent is barium sulfate. A solar concentrator is used in certain embodiments to collect and concentrate light onto a window on the bottom of the container. Solar cells lining the container walls and back collect light passing from the concentrator, through the window, diffused in the transfer fluid, and finally isotropically scattered onto the solar cell surfaces. The particular thermal transfer fluid chosen is transparent to those radiation wavelengths within the solar cell operating range, but is opaque with respect to certain of the longer (infrared) wavelengths. Because the thermal transfer fluid is opaque with respect to these infrared frequencies, it prevents them from every reaching the solar cells. In this way, the solar cells are kept cooler than the solar cells in prior art systems that employ diffusion. Although the infrared radiation cannot penetrate through the container to the solar cells, it is absorbed by the transfer fluid. This results in a heating of the transfer fluid at a point removed from the solar cells. This heat is drawn away from the container and stored in a heat storage facility through the use of a pump and heat exchange system.

The present invention primarily uses barium sulfate or other isotropic scattering agents rather than a luminescent material as a medium for isotropic scattering of incident light. Because the scattering is direct, rather than indirect scattering through luminescent re-emission, the transfer fluid is less susceptible to degradation due to incident light. This is a particularly important advantage when a solar concentrator is employed as in certain embodiments of the present invention. Luminescent material is still used in the present invention for its property of absorbing shorter wavelength light that cannot be efficiently converted by solar cells, and re-emitting light in a band that is more usable by photovoltaic cells. In a preferred embodiment, this luminescent material is of an inorganic type that is less susceptible to degradation in any event. These materials also have the important advantage that they do not create the re-absorption problems experienced with organic dyes. Since materials such as barium sulfate simply scatter rather than absorb incident radiation, they cannot create re-absorption efficiency losses. The inorganic dyes described above absorb in the ultraviolet band only and emit in the green band only, thereby also avoiding any re-absorption problems.

Another feature of certain embodiments of the present invention is the application of an anti-reflective solar cell coating with fluorescent properties. Such a coating would increase the efficiency of a solar cell by evolving longer wavelengths from shorter incident wavelengths in the same manner as the luminescent materials described above. In the preferred embodiment, the fluorescing anti-reflective coating is formed using a thin film of ZnS:Cu, Al. The particular combination of scattering material, luminescent material, and a fluorescing anti-reflective coating results in a system with efficiency not reached by prior art devices using similarly efficient solar cells.

The present invention need not be used with a solar concentrator, but is particularly well suited for such use. Unlike prior art systems, the application of a solar concentrator to the present system requires only that the fluid mixture be adjusted to optimize performance with the particular concentrator employed. For example, as a more high-power solar concentrator is used, the concentration of barium sulfate or other scattering agent in the transfer fluid is increased proportionally. The proper concentration of such material for peak performance with any particular light concentration arrangement may be mathematically derived.

It is therefore an object of the present invention to provide for a solar co-generator of increased efficiency.

It is a further object of the present invention to provide for a solar collection system using a transfer fluid that is transparent to certain wavelengths of light utilized by the solar cells but is opaque with respect to certain longer frequencies of light.

It is a still further object of the present invention to provide for a solar collection system using a transfer fluid suspension that isotropically scatters incident light prior to striking the solar cells.

It is also an object of the present invention to provide a solar co-generator that utilizes a transfer fluid with luminescent material to increase the photovoltaic efficiency of the solar cells.

It is also an object of the present invention to provide a solar cell with a fluorescing anti-reflective coating to increase the efficiency of the cell.

It is also an object of the present invention to provide a solar co-generator that is particularly well suited for use with solar concentrators.

These and other features, objects and advantages of the present invention will become better understood from a consideration of the following detailed description of the preferred embodiments and appended claims in conjunction with the drawings as described following:

DETAILED DESCRIPTION OF THE PREFERRED EMBODIMENTS

Figure 1:
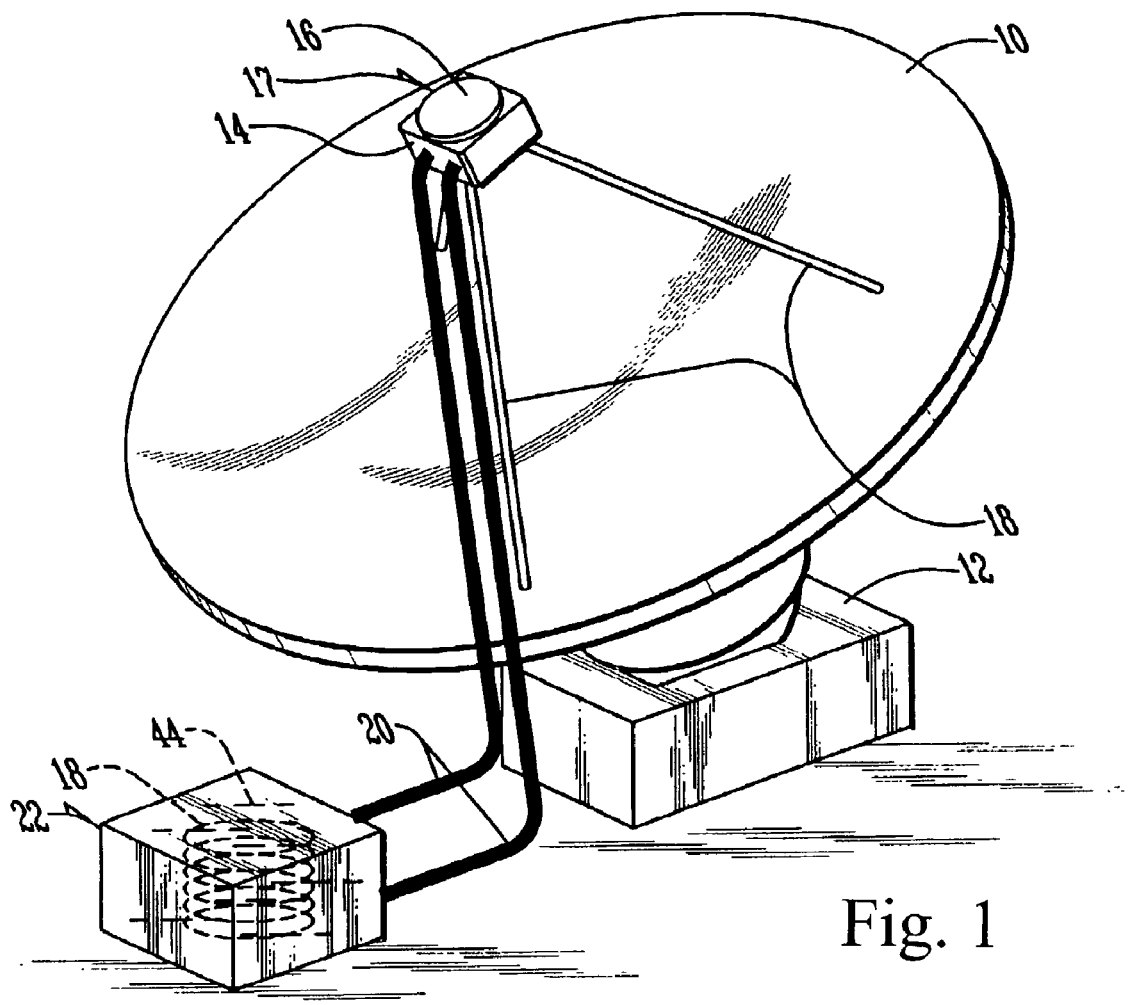
FIG. 1 is a schematic view of a preferred embodiment of the present invention.

With reference to FIG. 1, a preferred embodiment of the present invention may be described. A solar concentrator 10 is mounted on tracking system 12 in a suitable location to receive sunlight. Solar concentrator 10 in the illustrated embodiment is of the parabolic dish type. The interior of solar concentrator 10 is coated with a reflective material, such as aluminum foil, or the concentrator 10 may itself be formed of a reflective material. Alternative shapes for solar concentrator 10 may include other three-dimensional (or point-type) systems, two-dimensional (or linear-type) systems, such as a Fresnel lens, or any of the various other concentrator types that are known in the art.

The embodiment is ideally placed in a location that has a direct line of sight to the sun during a significant portion of the day. Tracking system 12 makes it possible for concentrator 10 to follow the sun as it progresses across the sky during the day. Such tracking systems may take many different forms as are well known by those skilled in the art.

At the focal point of solar concentrator 10 lies airtight collection chamber 14, as will be described more fully below. Collection chamber 14 is filled with, transfer fluid 44. Fluid conduit 20 connects the interior of collection chamber 14 to heat exchanger 18. Preferably, fluid conduit 20 comprises an inlet and outlet pipe, each of which are insulated by foam pipe insulation or other insulation materials as are known in the art. Fluid conduit 20 allows transfer fluid 44 to flow from collection chamber 14, through fluid conduit 20, through heat exchanger 18 located in heat storage unit 22, back through fluid conduit 20, and then once again into collection chamber 14. Fluid 44 is directed through this circuit by a fluid pump (not shown) of a conventional type that is capable of withstanding the heat generated during operation.

Mounted above collection chamber 14 is intensity sensor assembly 17. In the preferred embodiment, intensity sensor assembly 17 may comprise a metal disk covered with reflecting tape or other reflecting material. Intensity sensor assembly 17 mounts to solar concentrator 10 through support poles 18. Intensity sensor assembly 17 is attached to support poles 18 by screws, bolts, or other fastening means. Intensity sensor 16 is mounted on top of intensity sensor assembly 17 such that intensity sensor 16 is directed toward the sun as solar concentrator 10 moves in response to tracking system 12. Intensity sensor 16 functions to measure the intensity of solar radiation incident upon the system and controls the rate of flow of transfer fluid 44 through fluid conduit 20 based on the solar intensity. As solar radiation intensity increases, the rate of flow through the pump (not shown) is increased, and as the solar radiation intensity decreases (as, for example, while cloud cover persists), the rate of flow through the pump is decreased. In this way, excessive energy is not wasted in pumping transfer fluid 44 through the system when a lower rate of pumping would be sufficient for heat transfer and dissipation. Intensity sensor 16 is electrically coupled with the power to the pump in a means as would be well understood by those skilled in the art.

Figure 2:
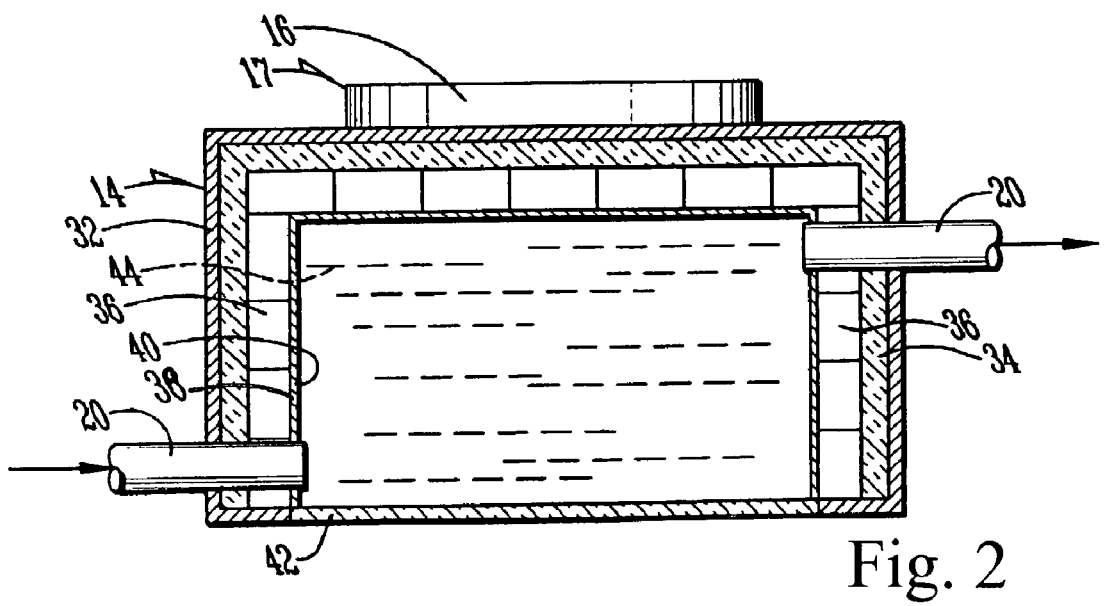
FIG. 2 is a schematic, partial cut-away view of the collection chamber of a preferred embodiment of the present invention.

Referring now to FIG. 2, the structure of collection chamber 14 may be described. Collection chamber housing 32 is an airtight, box-shaped chamber in the illustrated embodiment but may be of any convenient shape. Fluid conduit 18 provides means for transfer fluid 44 to enter and leave the interior of collection chamber 14. On the bottom side of collection chamber housing 32 is window 42, which may be constructed of glass, plastic, or other material that is transparent within the radiation band of interest. Lining the sides and top of the interior of collection chamber housing 32 is solar cell array 36. Preferably, solar cell array 36 is composed of high-efficiency semiconductor-based crystalline solar cells as are known in the art, but other types of solar cells may be used. Sandwiched between solar cell array 36 and the interior of collection chamber housing 32 is insulation 34, which serves to protect solar cell array 36 from conductive heating from the outside through collection chamber housing 32.

Figure 3:
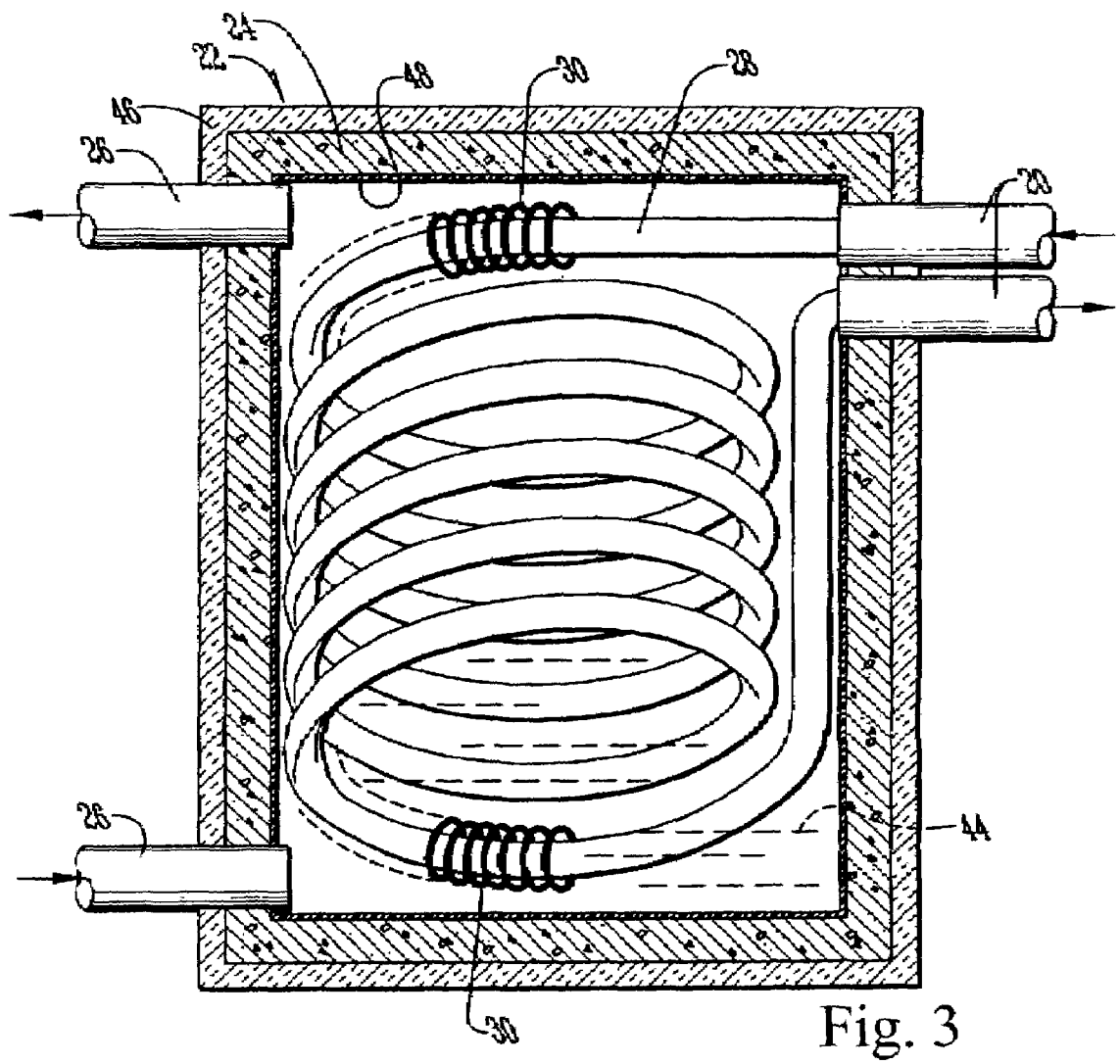
FIG. 3 is a schematic, partial cut-away view of a heat storage unit of a preferred embodiment of the present invention.

Referring now to FIG. 3, the structure of heat storage unit 22 in a preferred embodiment of the invention may be described. Heat storage unit housing 24 is constructed of concrete, which has heat storage capacities well known to those skilled in the art. In a preferred embodiment, heat storage unit housing 24 is surrounded by heat storage insulation 46 to provide further thermal isolation from the environment. Also in the preferred embodiment, heat storage unit housing 24 may be coated on its interior side with heat storage lining 48, which may be constructed of vinyl or any other appropriately non-reactive material. Extending through heat storage unit housing 24 is fluid conduit 18 (which, as already described, may preferably consist of two insulated pipes), and also hot water distribution duct 26.

Connected to fluid conduit 20 is heat exchanger 28, which is preferably shaped as one or more coils. Wrapped around the coils of heat exchanger 28 is flexible tubing 30. In the preferred embodiment, flexible tubing 30 is 1/16th inch plastic tubing filled with a eutectic salt such as sodium sulfate. It is believed that the addition of flexible tubing 30 filled with a eutectic salt will reduce incomplete recrystallization in heat transfer fluid 44; this is a process whereby heat is "trapped" in liquid phase after a large number of melting-crystallization cycles. In addition, sodium sulfate is an excellent heat storage medium, and the heat storage of the system is thus increased by the use of flexible tubing 30 filled with a eutectic salt.

Heat storage unit 22 is filled with a liquid that has good heat storage capabilities, such as water. Water flows in and out of heat storage unit 22 through hot water distribution duct 26, which preferably consists of two or more pipes. The hot water that leaves heat storage unit 22 may be used for heating or any other application to which hot water may be applied as are known in the art. A water pump (not shown) may be used to pump hot water through heat storage unit 22 for heating as hot water is needed.

The transfer fluid 44 of a preferred embodiment of the invention comprises a suspension of barium sulfate and inorganic phosphors in a 1:5 to 1:25 solution of potassium silicate and water. Specifically, transfer fluid 44 for one preferred embodiment of the invention has been created using 9 grams of barium sulfate added to 1.5 liters of a 1:16 solution of potassium silicate to water solution. The potassium silicate has three purposes. First, it acts as an anti-freeze agent. Second, it has an infrared absorption band and will therefore increase infrared absorption. Third, it is a dispersant for inorganic phosphors to prevent clumping. Potassium silicate solutions are manufactured by the PQ Corporation of Valley Forge, Pa. under the tradename Kasil. Other components may include sodium silicate, which can be used along with potassium silicate to control the viscosity of heat transfer fluid 44. Sodium silicate solutions are manufactured by the PQ Corporation under the tradename N Clear.

The isotropic scattering material used should preferably have the property that it absorbs radiation of a wavelength of about 650 nm or greater, and is transparent with respect to radiation of a wavelength of less than 650 nm. Since transfer fluid 44 is used to deliver thermal energy by the action of pumping it through heat storage unit 22, it should have the properties of low viscosity, high heat capacity, and a high heat transfer coefficient. Thus transfer fluid 44 essentially captures the IR portion of the solar spectrum as heat, delivers it to heat storage, and leaves the visible portion of the solar spectrum available for photovoltaic conversion.

One class of inorganic phosphors that may be used in a preferred embodiment is the zinc sulfide type, such as phosphor numbers 2312, 2363, and 1260 manufactured by Osram Sylvania of Danvers, Mass. In operation, the inorganic phosphors absorb solar energy in a broad band of about 305 nm to 450 nm (corresponding to a band from near UV to blue), and re-emit radiation in narrow bands centered at 526 nm and 623 nm (green and red, respectively). This longer-wavelength radiation is emitted isotropically, so the phosphors also provide some degree of a light-trapping function, although the bulk of this function is preferably performed by the isotropic scattering component of transfer fluid 44. These phosphors are poor choices as the sole means of isotropic scattering in transfer fluid 44 because they have a narrow absorption peak, and thus only light absorbed about that peak turns to fluorescence. The barium sulfate or other isotropic scattering agent of the preferred embodiment of the invention lacks this significant limitation. In addition, barium sulfate is chemically stable, is heat resistant (unlike organic phosphors that degrade quickly), and is very inexpensive when compared to prior art methods. It should be noted that the churning action of the pump may function to maintain the phosphors in suspension within transfer fluid 44; this is important with respect to the preferred class of phosphors, since unlike prior art methods that use liquid phosphors, these phosphors are solids that are simply suspended in the water-silicate solution along with barium sulfate.

Figure 4:
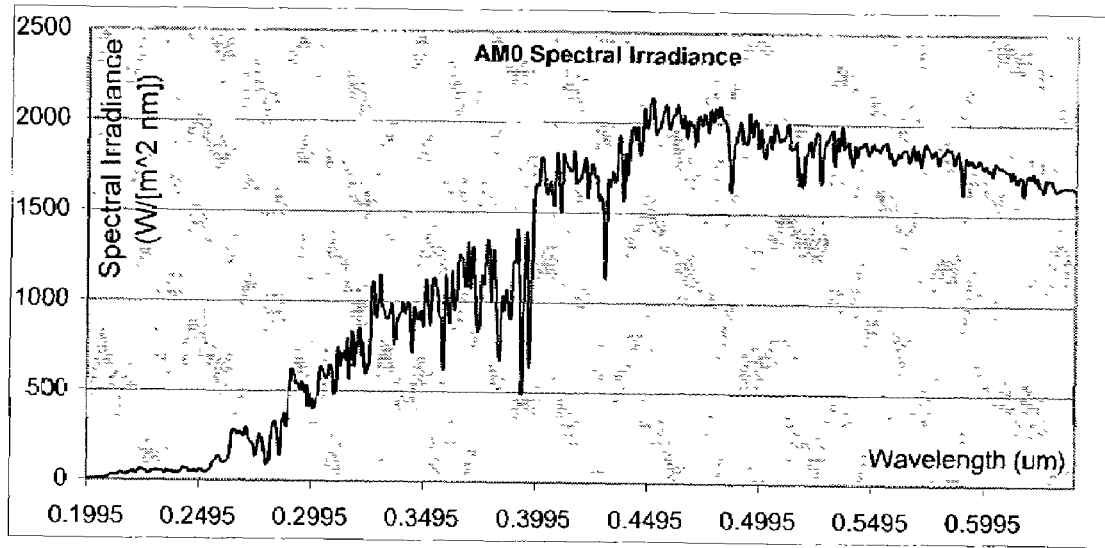
FIG. 4 is a graph showing the spectral irradiance of the sun across a defined wavelength band.
Figure 5:
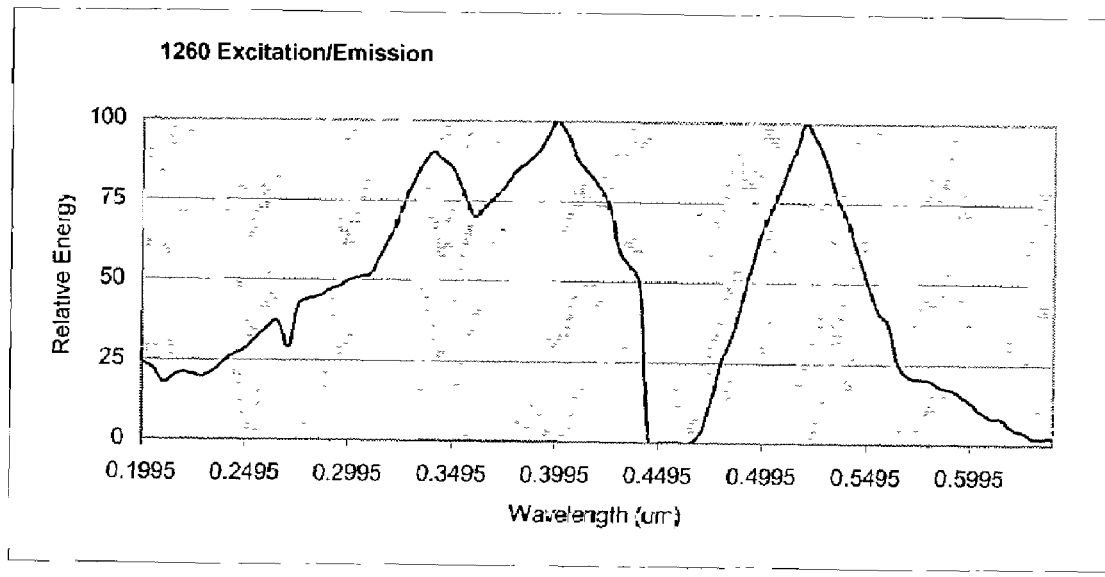
FIG. 5 is a graph showing the relative energy of excitation/emission for a particular inorganic phosphor across the wavelength band of FIG. 4.

The increase in photo-generated current $J_L$ from longer-wavelength phosphor re-emission may be estimated by assuming that a fraction of the energy in the AM0 spectral distribution, corresponding to the excitation band of a commercially available phosphor, was shifted to wavelengths corresponding to the emission band of the phosphor. The net effect of the phosphor may therefore be modeled as increasing the area under the AM0 distribution at longer wavelengths while decreasing area at shorter wavelengths. The photo-generated current could then be found from $$J_L \approx \frac{q}{hc} \int_0^{\lambda_G} \lambda \phi_m(\lambda) d\lambda$$

as developed in Partain, L. D., Solar Cells and their Applications, John Wiley and Sons, Inc., (1995), which is incorporated herein by reference. The value $\phi_m(\lambda)$ is the modified AM0 spectral distribution shown in FIG. 6, which is obtained by shifting area from regions of short wavelength to regions of long wavelength. FIG. 4 shows the AM0 spectral irradiance values $\phi(\lambda)$ from Wehrli, C., Extraterrestrial Solar Spectrum, Pub. No. 615, Physikalisch-Meteorologisches Observatorium and World Radiation Center, Davos, Switzerland, which is incorporated by reference herein. FIG. 5 shows the percent energy absorbed, RA, and the percent energy emitted, RE, on the excitation and emission bands of a particular ZnS type phosphor, Osram Sylvania 1260, used in a preferred embodiment of the present invention. Since only the wavelengths corresponding to the excitation and emission bands of 1260 are assumed to contribute to the change in photo-generated current, one may numerically integrate $$\Delta J_L \approx \frac{q}{hc} \left( \int_{200}^{450} \lambda (\phi_m(\lambda) - \phi(\lambda)) d\lambda + \int_{470}^{640} \lambda (\phi_m(\lambda) - \phi(\lambda)) d\lambda \right)$$

where (200 nm, 450 nm) and (470 nm, 640 nm) are the excitation and emission bands of phosphor 1260. The value of $\phi_m(\lambda)$ may be obtained by first assuming that AM0 radiation was direct-normally incident on a volume with zero surface reflectivity and containing enough phosphor 1260 to absorb 100% of the incident radiation at 200 nm, which is the peak excitation wavelength for this particular phosphor. Assuming that 100% of incident radiation was absorbed at 200 nm, one may estimate what percent of incident radiation was absorbed on the entire excitation band. If the excitation band in FIG. 5 is then partitioned into 49 sub-bands, each 5 nm long, then the midpoint formula may be used to find the average percent radiation absorbed, $(RA)_{iav}$, of RA on the $i^{th}$ sub-band of the (200 nm, 450 nm) band. One may likewise partitioned the (200 nm, 450 nm) band of the AM0 distribution in FIG. 5 into 49 sub-bands of 5 nm width; each sub-band defined a rectangular cross section on the figure one curve of area $A_{ia} = (5 \text{ nm})^{\phi_{avis}}$, where $\phi_{avis}$ is the average value of $\phi(\lambda)$ on the $i^{th}$ sub-band of (200 nm, 450 nm). One may then multiply each $A_{ia}$ by the corresponding $(RA)_{iav}$ to determine how much area to subtract from the $i^{th}$ cross section in FIG. 4. This area may be subtracted as a rectangle 5 nm long and $h_{ix}$ W/m²nm high.

One may determine $h_{ix}$ from the condition $5h_{ix} = (RA)_{iav} A_{ia}$. The total area subtracted from the 49 sub-bands on (200 nm, 450 nm) in FIG. 4 is 131W/m², which is about ten percent of the total AM0 direct-normal spectral irradiance as explained in Wehrli.

Figure 6:
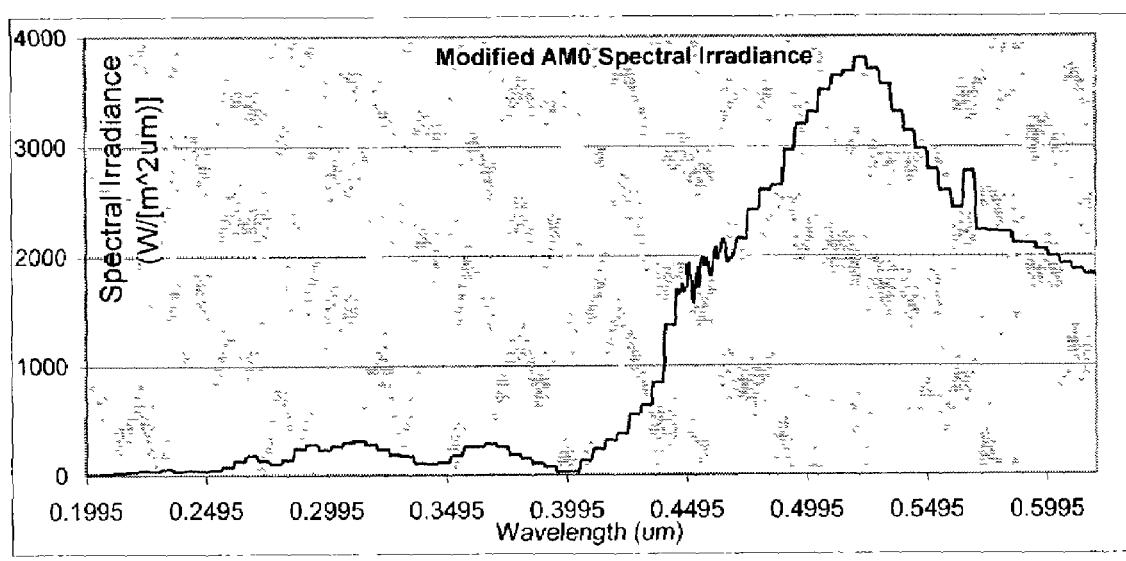
FIG. 6 is a graph showing the modified spectral irradiance of the sun after application of the light through the inorganic phosphor of FIG. 5 across the wavelength band of FIG. 4.

The value of $\phi_m(\lambda)$ on the (470 nm, 635 nm) band of FIG. 6 may be generated by first partitioning the emission band of FIG. 5 into 35, 5 nm long sub-bands. Each such sub-band on figure two defines a rectangular cross section of area $A_{csi} = (5 \text{ nm})(RE)_{iav}$ where $(RE)_{iav}$ is the average percent radiation emitted, RE, on the $i^{th}$ sub-band of FIG. 4. Therefore, the fraction of the total radiation absorbed by phosphor 1260 that is subsequently fluoresced into the $i^{th}$ sub-band of (470 nm, 635 nm) is $$A_{\%\,i} \approx \frac{A_{csi}}{\sum_{1}^{35} A_{csi}}.$$

One may partition the (470 nm, 635 nm) band of FIG. 4 into 35, 5 nm long sub-bands and find the average value of $\phi(\lambda)$ on each 5 nm sub-band, namely $\phi_{avim}$. As before, each 5 nm sub-band defines a rectangular cross section of area (5 nm)$(\phi_{avim})$ and to each such cross section one may add an area of (131W/m²) $(A_{\%i})$ as a rectangle 5 nm long and $h_{im}$W/m²-nm, with $h_{im}$ determined from the condition $5 h_{im} = (131) (A_{\%i})$.

The total change in photo generated current is the sum of the decrease $\Delta J_L$–on (200 nm, 450 nm) and the increase $\Delta J_L$+on (470 nm, 640 nm), which is given by the equation provided above. This area can be approximated with the rectangle rule and one may then calculate a $\Delta J_L$– of 13.7 mA/cm² and a $\Delta J_L$+ of 56.52 mA/cm². This gives a net photo-generated current increase of $\Delta J_L = 4.29$ mA/cm². According to Partain, the photo generated current equation given above can be used to calculate the maximum short circuit current of a Shockley n/p diode, and so the 4.29 mA/cm² result gives the maximum increase in short circuit current above that predicted for AM0 spectral irradiance assuming a semiconductor with a band gap less then about 1.9 eV. Assuming that the maximum short circuit current for silicon is about 54 mA/cm², a $\Delta J_L = 4.29$ mA/cm² gives a maximum increase in efficiency of about 8% from the use of the 1260 phosphor.

The equations above show how the phosphors absorb in UV to blue and emit at green and red wavelengths. The photo-generated current is proportional to the integral of wavelength times a wavelength dependent distribution function. The quantum efficiency (QE) of amorphous silicon is greater in the green and red bands than in UV to blue bands. So for the same total photon energy, there is an increase in photo-generated current at long wavelengths: for every electron generated by a blue photon, ~1.1 electrons are generated by a green photon and ~1.15 electrons are generated by a red photon, neglecting the increase in photo-generated current due to enhanced QE at green and red wavelengths. As already explained, the preferred embodiment includes an inorganic luminescent material in a suspension with an isotropic scattering medium, preferably barium sulfate. Since phosphors in the heat transfer liquid 44 absorb more visible light than just the heat transfer liquid 44 alone, the phosphor concentration in transfer fluid 44 must be optimized in order to absorb all of the available shorter wavelength radiation and re-emit longer wavelength radiation. For example, suppose $N_{ph}$ and $N_{ph}^{Sat}$ are the concentration of phosphor given and the concentration of phosphor required to absorb the entire 400 nm light content in solar radiation. Assuming $N_{ph} \leq N_{ph}^{Sat}$, then the phosphor absorbs according to the spectral distribution function $$\phi_{ab}(\lambda) = \phi_{amo}(\lambda)\left(\frac{N_{ph}}{N_{ph}^{Sat}}\right)e^{-\frac{(\lambda-\lambda_{ab})^2}{\sigma}}.$$

The phosphor fluoresces according to a spectral distribution function such that $$\phi_{fl}^*(\lambda) = \phi_{fl}(\lambda) - \phi_w(\lambda).$$

The term $\phi_{fl}(\lambda)$ is for 100% QE and is given by the distribution function $$\phi_{fl}(\lambda) = \phi_{amo}(\lambda)\left(\frac{N_{ph}}{N_{ph}^{Sat}}\right)e^{-\frac{(\lambda-\lambda_{ab})^2}{\sigma}}\left(e^{-\frac{(\lambda-\lambda_{fl})^2}{\sigma'}}\right).$$

The term $\phi_w(\lambda)$ is a correction that accounts for the fraction of light energy absorbed that is not fluoresced and is given by the distribution function $$\phi_w = \phi_{amo}(1 - e^{-k(\lambda)N_{ph}}),$$

where $k(\lambda)$ is related to a silicon absorption coefficient. The modified spectral distribution due to the phosphor can therefore be written:

$$\phi_{mod}(\lambda) = \phi_{amo}(\lambda) - \phi_{amo}(\lambda)\left(\frac{N_{ph}}{N_{ph}^{Sat}}\right)e^{-\frac{(\lambda-\lambda_{ab})^2}{\sigma}} +$$
$$\phi_{amo}\left(1 - e^{-k(\lambda)N_{ph}}\right) + \phi_{amo}(\lambda)\left(\frac{N_{ph}}{N_{ph}^{Sat}}\right)e^{-\frac{(\lambda-\lambda_{ab})^2}{\sigma}}\left(e^{-\frac{(\lambda-\lambda_{fl})^2}{\sigma'}}\right).$$

Since $J_{PH} = q/hc \int \lambda \phi(\lambda) d\lambda$, in order to break even one must have $$\int \lambda \phi_{amo}(\lambda) d\lambda = \int \lambda \phi_{mod}(\lambda) d\lambda$$

which means that $$\int \lambda \phi_{amo}(\lambda)\left(\frac{N_{ph}}{N_{ph}^{Sat}}\right)e^{-\frac{(\lambda-\lambda_{ab})^2}{\sigma}} d\lambda =$$
$$\int \lambda \phi_{amo}(\lambda)\left(\frac{N_{ph}}{N_{ph}^{Sat}}\right)e^{-\frac{(\lambda-\lambda_{ab})^2}{\sigma}}\left(e^{-\frac{(\lambda-\lambda_{fl})^2}{\sigma'}}\right)d\lambda + \int \lambda \phi_{amo}(1 - e^{-k(\lambda)N_{ph}})d\lambda.$$

Referring again to FIG. 2, solar cell array 36 may in the preferred embodiment be coated with fluorescent anti-reflective coating (FARC) 38. FARC 38 has two purposes. The first purpose is to prevent the loss of efficiency due to reflective losses at the point of light entry into solar cell array 36. For this purpose, the refractive index of FARC 38 is determined by the refractive index of the protecting coating 40 that is deposited over FARC 38. Protective coating 40 serves to prevent damage to the solar cell array 36 by transfer fluid 44. Protective coating 40 must therefore have the property that it does not react with transfer fluid 44. A number of such coating materials are known in the art, but a thin layer of silicon dioxide (glass) is used in the preferred embodiment.

The second purpose of FARC 38 is to further increase the photo-generated current from solar cell array 36 by evolving longer wavelength radiation from shorter wavelengths. In the preferred embodiment, a thin film of ZnS:Cu,Al is used to form FARC 38. A 1.33 μm thick layer of this material may be resistively evaporated at $10^{-5}$ torr from a graphite crucible onto glass substrates. It has been experimentally determined that the emission band of this resistively deposited film corresponds to the emission band of the commercial ZnS type phosphor as described above. It has also been determined that ZnS and ZnS:Cu,Al have essentially identical refractive indices. Absorption coefficient ($\alpha$) vs. wavelength ($\lambda$) was obtained for the ZnS and ZnS:Cu,Al samples by dividing the thickness of each film into its spectrophotometer data. The $\alpha$ vs. $\lambda$ curves were applied as a filter to the AMO spectral distribution to generate modified AMO distributions. On a wavelength band of 325 nm to 625 nm, $\int \lambda \phi mod(\lambda)d\lambda$ for ZnS:Cu,Al was found to be 2% larger than for ZnS, thus confirming the fluorescing nature of the material. This fluorescence results in a corresponding increase in efficiency generated through the use of ZnS:Cu,Al instead of ZnS in an anti-reflective coating.

Although the preferred embodiment of the invention has been described for use with a solar concentrator 10, other embodiments may be used with no concentrator. In these embodiments, window 42 would simply be placed toward the incident light, or toward a mirror, prism, or other means that directs light to the present invention. As explained above, the optimum mix of isotropic scattering medium and phosphor must be selected given the light concentration factor used with respect to the invention; however, the present invention allows for easy adjustment to light concentration by simply modifying this mix.

The present invention has been described with reference to certain preferred and alternative embodiments that are intended to be exemplary only and not limiting to the full scope of the present invention as set forth in the appended claims.

What is claimed is:

1. An apparatus for generating energy from incident radiation emitted by a source, the apparatus comprising:
   (a) a photovoltaic cell; and
   (b) a fluid disposed between said cell and said source, wherein said fluid is transparent with respect to at least a first band of the incident radiation, said fluid is opaque with respect to at least a second band of the incident radiation, said fluid isotropically reflects at least a portion of the incident radiation, and said fluid comprises barium sulfate in a ratio of six grams of barium sulfate per liter of said fluid.

2. The apparatus of claim 1, wherein said fluid is transparent with respect to at least a portion of the visible band of the incident radiation and is opaque with respect to at least a portion of the infrared band of the incident radiation.

3. The apparatus of claim 1, further comprising a source intensity sensor, wherein a flow rate of said fluid is controlled by said intensity sensor.

4. The apparatus of claim 1, wherein said fluid comprises a luminescent material.

5. The apparatus of claim 4, wherein said luminescent material comprises an inorganic phosphor.

6. The apparatus of claim 4, wherein said luminescent material absorbs at least a portion of the incident radiation and emits radiation at a longer wavelength than the incident radiation.

7. The apparatus of claim 6, wherein said luminescent material comprises zinc sulfide.

8. The apparatus of claim 4, wherein said fluid further comprises a silicate and water solution.

9. The apparatus of claim 8, wherein a ratio of said barium sulfate and said luminescent material to said silicate and water solution is in the range of 1:5 to 1:25 by volume.

10. The apparatus of claim 1, further comprising a solar concentrator positioned to concentrate radiation from the source onto said fluid.

11. The apparatus of claim 1, further comprising a circulation system encapsulating said fluid.

12. The apparatus of claim 11, wherein said circulation system comprises:
    (a) a fluid chamber;
    (b) a fluid conduit in communication with said chamber;
    (c) a heat exchanger in communication with said fluid conduit; and
    (d) a heat storage block in communication with said heat exchanger.

13. The apparatus of claim 12, further comprising a heat storage coil adjacent said heat exchanger, wherein said heat storage coil comprises an eutectic salt.

14. The apparatus of claim 13, wherein said eutectic salt is sodium sulfate.

15. The apparatus of claim 1, further comprising a fluorescing anti-reflective coating between said photovoltaic cell and said fluid.

16. The apparatus of claim 15, wherein said anti-reflective coating comprises ZnS:Cu, Al.

17. An apparatus for generating energy from incident radiation emitted by a source, the apparatus comprising:
    (a) a chamber comprising an inner face and outer face;
    (b) a solar cell attached to said inner face of said chamber;
    (c) a window passing through said chamber; and
    (d) a transfer fluid within said chamber comprising barium sulfate in a ratio of six grams of banum sulfate per liter of said transfer fluid.

18. The apparatus of claim 17, wherein said fluid is transparent with respect to at least a first band of the incident radiation, said fluid is opaque with respect to at least a second band of the incident radiation, and said fluid isotropically reflects the incident radiation.

19. The apparatus of claim 18, wherein said fluid is transparent with respect to at least a portion of the visible band of the incident radiation and is opaque with respect to at least a portion of the infrared band of the incident radiation.

20. The apparatus of claim 17, further comprising a source intensity sensor, wherein a flow rate of said fluid is controlled by said intensity sensor.

21. The apparatus of claim 17, wherein said fluid comprises a luminescent material.

22. The apparatus of claim 21, wherein said luminescent material comprises an inorganic phosphor.

23. The apparatus of claim 21, wherein said luminescent material absorbs at least a portion of the incident radiation and emits radiation at a longer wavelength than the incident radiation.

24. The apparatus of claim 23, wherein said luminescent material comprises zinc sulfide.

25. The apparatus of claim 21, wherein said fluid further comprises a silicate and water solution.

26. The apparatus of claim 25, wherein a ratio of said barium sulfate and said luminescent material to said silicate and water solution is in the range of 1:5 to 1:25 by volume.

27. The apparatus of claim 17, wherein said inner face comprises a back and a plurality of sides, and comprising a solar cell attached to at least one of said sides.

28. The apparatus of claim 27, further comprising a solar cell attached to said back and each of said sides.

29. The apparatus of claim 17, further comprising a solar concentrator positioned to concentrate radiation from the source onto said fluid.

30. The apparatus of claim 17, further comprising a circulation system encapsulating said fluid.

31. The apparatus of claim 30, wherein said circulation system comprises:
    (a) a fluid conduit in communication with said inner face of said chamber;
    (b) a heat exchanger in communication with said fluid conduit; and
    (c) a heat storage block in communication with said heat exchanger.

32. The apparatus of claim 31, further comprising a heat storage coil adjacent said heat exchanger, wherein said heat storage coil comprises an eutectic salt.

33. The apparatus of claim 32, wherein said eutectic salt is sodium sulfate.

34. The apparatus of claim 17, further comprising a fluorescing anti-reflective coating between said solar cell and said fluid.

35. The apparatus of claim 34, wherein said coating comprises ZnS:Cu, Al.

36. An apparatus for generating energy from incident radiation emitted by a source, the apparatus comprising:
    (a) a photovoltaic cell;
    (b) a fluid disposed between said cell and the source; and
    (c) a circulation system encapsulating said fluid, comprising:
        (i) a fluid chamber;
        (ii) a fluid conduit in communication with said chamber;
        (iii) a heat exchanger in communication with said fluid conduit;
        (iv) a heat storage block in communication with said heat exchanger; and
        (v) a heat storage coil adjacent said heat exchanger, wherein said heat storage coil comprises an eutectic salt.

* * * * *